US006208033B1

(12) United States Patent
Doan et al.

(10) Patent No.: US 6,208,033 B1
(45) Date of Patent: Mar. 27, 2001

(54) APPARATUS HAVING TITANIUM SILICIDE AND TITANIUM FORMED BY CHEMICAL VAPOR DEPOSITION

(75) Inventors: Trung T. Doan; Gurtej Singh Sandhu; Kirk Prall; Sujit Sharan, all of Boise, ID (US)

(73) Assignee: Micron Technology Inc., Boise, ID (US)

( * ) Notice: Subject to any disclaimer, the term of this patent is extended or adjusted under 35 U.S.C. 154(b) by 0 days.

(21) Appl. No.: 09/377,253

(22) Filed: Aug. 19, 1999

Related U.S. Application Data

(62) Division of application No. 08/915,986, filed on Aug. 21, 1997.

(51) Int. Cl.[7] .............................................. H01L 21/4763
(52) U.S. Cl. ......................... 257/770; 257/734; 257/773
(58) Field of Search ............................ 438/618; 257/734, 257/770, 773

(56) References Cited

U.S. PATENT DOCUMENTS

| 4,340,617 | 7/1982 | Deutsch et al. ................ 427/53.1 |
| 4,359,490 | 11/1982 | Lehrer ................................ 427/95 |
| 4,713,258 | 12/1987 | Umemura .......................... 427/35 |
| 4,721,631 | 1/1988 | Endo et al. ........................ 427/66 |
| 4,868,005 | 9/1989 | Ehrlich et al. ................. 427/53.1 |
| 4,876,112 | 10/1989 | Kaito et al. ...................... 427/38 |
| 4,884,123 | * 11/1989 | Dixit et al. . |
| 4,923,717 | 5/1990 | Gladfelter et al. .............. 427/252 |

(List continued on next page.)

FOREIGN PATENT DOCUMENTS

| 0798777 | 10/1997 | (EP) . |
| 8-176823 | 7/1996 | (JP) . |
| 98/34445 | 8/1998 | (WO) . |

OTHER PUBLICATIONS

Bachmann, P., et al., "Plasma–Assisted Chemical Vapor Deposition Processes", *MRS Bulletin*, 52–59, (Dec., 1988).

Bouteville, A., et al., "TiSi2 Selective Growth in a rapid thermal low pressure chemical vapor depositoin system", *Journal of the Electrochemical society*, Manchester, NH, US, pp. 2260–2263, (Aug. 1992).

Cowher, M., et al., "Low Temperature CVD Garnet Growth", *J. Crystal Growth*, 46, 399–402, (1979).

Engqvist, J., et al., "Selective deposition of TiSi2 from H2–TiCl4 Gas mixtures and si: Aspects of Thermodynamics including Critical evaluation of thermochemical data in the Ti–Si System", *Journal of the Electrochemical Society*, Manchester, NH, US, pp. 3197–3205, (Nov. 1992).

(List continued on next page.)

*Primary Examiner*—Kevin M. Picardat
*Assistant Examiner*—D. M. Collins
(74) *Attorney, Agent, or Firm*—Schwegman, Lundberg, Woessner & Kluth, P.A.

(57) ABSTRACT

Apparatus having titanium silicide and titanium formed by chemical vapor deposition (CVD) in a contact. The chemical vapor deposition includes forming titanium silicide and/or titanium by combining a titanium precursor in the presence of hydrogen, $H_2$. The chemical vapor deposition may further include forming titanium silicide and/or titanium by combining titanium tetrachloride, $TiCl_4$, in the presence of hydrogen. The chemical vapor deposition may further include forming titanium silicide and/or by combining tetradimethyl amino titanium, $Ti(N(CH_3)_2)_4$, in the presence of hydrogen. For production of titanium silicide, reaction of the titanium precursor may occur with a silicon precursor or a silicon source occurring as part of the contact. Use of a silicon precursor reduces depletion of a silicon base layer in the contact.

8 Claims, 4 Drawing Sheets

U.S. PATENT DOCUMENTS

| | | | |
|---|---|---|---|
| 4,957,777 | 9/1990 | Ilderem et al. | 427/55 |
| 4,971,655 | 11/1990 | Stefano et al. | 156/659.1 |
| 5,005,519 | 4/1991 | Egermeier et al. | 118/722 |
| 5,015,330 | 5/1991 | Okumura et al. | 156/643 |
| 5,022,905 | 6/1991 | Grundy et al. | 65/60.51 |
| 5,032,233 | 7/1991 | Yu et al. | 204/192.28 |
| 5,049,975 | 9/1991 | Ajika et al. | 357/71 |
| 5,124,780 | 6/1992 | Sandhu et al. | 357/67 |
| 5,136,362 | 8/1992 | Grief et al. | 357/67 |
| 5,147,819 | 9/1992 | Yu et al. | 437/173 |
| 5,173,327 | 12/1992 | Sandhu et al. | 427/573 |
| 5,192,589 | 3/1993 | Sandhu | 427/255.1 |
| 5,196,360 | 3/1993 | Doan et al. | 437/41 |
| 5,202,579 | 4/1993 | Fujii et al. | 257/751 |
| 5,227,331 | 7/1993 | Westmoreland | 437/174 |
| 5,227,334 | 7/1993 | Sandhu | 437/190 |
| 5,240,739 | 8/1993 | Doan et al. | 427/126.1 |
| 5,246,881 | 9/1993 | Sandhu et al. | 437/192 |
| 5,252,518 | 10/1993 | Sandhu et al. | 437/200 |
| 5,254,499 | 10/1993 | Sandhu et al. | 437/192 |
| 5,258,096 | 11/1993 | Sandhu et al. | 156/643 |
| 5,273,783 | 12/1993 | Wanner | 427/250 |
| 5,275,715 | 1/1994 | Tuttle | 205/123 |
| 5,278,100 | 1/1994 | Doan et al. | 437/200 |
| 5,306,951 | 4/1994 | Lee et al. | 257/755 |
| 5,320,880 | 6/1994 | Sandhu et al. | 427/578 |
| 5,341,016 | 8/1994 | Prall et al. | 257/412 |
| 5,344,792 | 9/1994 | Sandhu et al. | 437/200 |
| 5,374,591 | 12/1994 | Hasegawa et al. | 437/187 |
| 5,376,405 | 12/1994 | Doan et al. | 427/126.1 |
| 5,381,302 | 1/1995 | Sandhu et al. | 361/305 |
| 5,384,284 | 1/1995 | Doan et al. | 437/190 |
| 5,384,289 | 1/1995 | Westmoreland | 437/245 |
| 5,391,410 | 2/1995 | Nii et al. | 427/578 |
| 5,393,564 | 2/1995 | Westmoreland et al. | 427/248.1 |
| 5,399,379 | 3/1995 | Sandhu | 427/255.2 |
| 5,416,045 | 5/1995 | Kauffman et al. | 437/174 |
| 5,425,392 | 6/1995 | Thakur et al. | 437/173 |
| 5,453,640 | 9/1995 | Kinoshita | 257/520 |
| 5,459,353 | 10/1995 | Kanazawa | 257/751 |
| 5,496,762 | 3/1996 | Sandhu et al. | 437/60 |
| 5,506,166 | 4/1996 | Sandhu et al. | 437/60 |
| 5,508,066 | 4/1996 | Akahori | 427/571 |
| 5,567,243 | 10/1996 | Foster et al. | 118/730 |
| 5,571,572 | 11/1996 | Sandhu | 427/585 |
| 5,575,708 | 11/1996 | Chau et al. | 451/305 |
| 5,595,784 | 1/1997 | Kaim et al. | 427/255.2 |
| 5,607,722 | 3/1997 | Vaartstra et al. | 427/248.1 |
| 5,633,200 | 5/1997 | Hu | 438/653 |
| 5,641,545 | 6/1997 | Sandhu | 427/573 |
| 5,644,166 | 7/1997 | Honeycutt et al. | 257/754 |
| 5,693,557 | 12/1997 | Hirao et al. | 437/60 |
| 5,747,116 | 5/1998 | Sharan et al. | 427/534 |
| 5,773,890 | 6/1998 | Uchiyama et al. | 257/753 |
| 5,834,371 | 11/1998 | Ameen et al. | 438/656 |
| 5,956,595 | 9/1999 | Zenke | 438/398 |
| 5,973,402 | 10/1999 | Shinriki et al. | 257/768 |
| 6,031,288 * | 2/2000 | Todorobaru et al. | |

OTHER PUBLICATIONS

Esquivel, A., et al., "Electrical and Physical Characteristics of Dry Oxygen, High Pressure Oxidation for SUB–0.5 um CMOS Isolation", *Abst. Int'l Electron Devices Meeting*, (1994).

Herman, I., "Laser–Assisted Deposition of Thin Films from Gas–Phase and Surface–Adsorbed Molecules", *Chem. Rev.*, 89, 1323, 1346–1349, (1989).

Ilderem, V., et al., "Optimized Deposition Parameters for Low Pressure Chemical Vapor Deposited Titanium Silicide", *J. Electrochemical Soc. : Solid State Science and Technology*, 2590–2596, (Oct. 1988).

Lee, J., et al., "Plasma enhanced chemical vapor deposition of blanket TiSi2 on oxide patterned wafers", *Journal of the Electrochemical society*, Manchester, NH, US, pp. 1159–1165, (Apr. 1992).

Lie, L., et al., "High Pressure Oxidation of Silicon in Dry Oxygen", *J. Electrochemical Soc. : Solid State Science and Technology*, 2828–2834, (Dec. 1982).

Moeller, T., et al., "Semiconducting Elements, Ch. 30", *In: Chemistry with Inorganic Qualitative Analysis*, 2nd Edition, Academic Press, 995–996, (1984).

Morosanu, C., *Thin Films by Chemical Vapor Deposition*, Elsevier, N. Y., 42–54 & 460–475, (1990).

Panson, A., et al., "Chemical Vapor Deposition of YBa (2) Cu (3) O (7) Using Metalorganic Chelate Precursors", *Appl. Phys. Lett.*, 53, 1756–1758, (Oct., 1988).

Rosler, R., et al., "Plasma–Enhanced CVD of Titanium Silicide", *J. Vacuum Science Tech.*, B 2, 733–737, (Oct./Dec. 1984).

Wolf, S., *Silicon Processing for the VLSI Era, vol. 2: Process Integration*, Lattice Press, Sunset Beach, California, pp. 202–203, (1990).

Yu, M., et al., "Surface Chemistry of the WF(6)—Based Chemical Vapor Deposition of Tungsten", *IBM J. Research Development*, 34, 875–883, (Nov. 1990).

U.S. application No. 09/030,705, filed Feb. 25, 1998, Attorney Docket 00303.289US1 Chemical Vapor Deposition of Titanium.*

U.S. application No. 09/377,265, filed Aug. 19, 1999, Attorney Docket 00303.213US3 Methods of Forming a Contact Having Titanium Silicide and Titanium Formed by Chemical Vapor Deposition.*

U.S. application No. 09/377,273, filed Aug. 19, 1999, Attorney Docket 00303.213US4 Methods of Forming a Contact Having Titanium Silicide Formed by Chemical Vapor Deposition.*

U.S. application No. 09/376,023, filed Aug. 19, 1999, Attorney Docket 00303.213US5 Methods of Forming a Contact Having Titanium Formed by Chemical Vapor.*

U.S. application No. 09/389,562, filed Sep. 3, 1999, Attorney Docket 00303.289US2 Apparatus Having a Titanium Alloy Layer.*

* cited by examiner

APPARATUS HAVING TITANIUM SILICIDE AND TITANIUM FORMED BY CHEMICAL VAPOR DEPOSITION

This application is a Divisional of U.S. application Ser. No. 08/915,986, filed Aug. 21, 1997.

FIELD OF THE INVENTION

The present invention relates to a method for manufacturing semiconductor devices, and in particular, to a method for forming titanium silicide within electrical contacts and apparatuses including such electrical contacts.

BACKGROUND OF THE INVENTION

Device density in integrated circuits (ICs) is constantly being increased. To enable the increase in density, device dimensions are being reduced. As the dimensions of device contacts get smaller, device contact resistance increases, and device performance is adversely affected. Methods for decreasing device contact resistance in ICs are needed to obtain enhanced device and IC performance.

Device contacts with reduced resistance may be created by forming certain metals on a silicon semiconductor base layer. These metals react with the underlying silicon, for example, to form silicides. Silicide device contacts are desirable because they reduce the native oxide on silicon. The native oxide is undesirable because it increases the contact resistance.

Titanium is preferably used to form silicide device contacts for two reasons. First, titanium silicide has superior gettering qualities. Also, titanium silicide forms low resistance contacts on both polysilicon and single-crystal silicon.

Device contacts are normally formed with the following process. First, a thin layer of titanium is formed on top of the silicon base layer, such as a substrate. The titanium adjoins active regions exposed by contact holes in an isolating layer, such as an oxide, above the silicon base layer. Then, the silicon base layer is annealed. As a result, the titanium reacts with the active regions of silicon to form titanium silicide.

Ultimately, an electrically conductive plug material, such as tungsten, fills the contact hole to facilitate external electrical connection to the contact. However, plug materials, such as tungsten, adhere poorly to titanium silicide. Additionally, to ensure low contact resistivity, aluminum or polysilicon plug materials should not be intermixed with the titanium silicide and underlying silicon base layer. Accordingly, a barrier layer is formed over the titanium silicide to prevent diffusion of the titanium silicide and silicon base layer into the plug material. The barrier layer also causes the plug material to adhere to the IC.

Titanium nitride is a desirable barrier layer because it is an impermeable barrier for silicon, and because the activation energy required for the diffusion of other impurities is very high. Titanium nitride is also chemically and thermodynamically stable, and has a relatively low resistivity. Titanium nitride can be formed on the substrate by (1) evaporating titanium in a nitrogen ambient, (2) reactively sputtering titanium in an argon and nitrogen mixture, (3) sputtering from a titanium nitride target in an inert argon ambient, (4) sputter depositing titanium in an argon ambient, and converting the titanium to titanium nitride subsequently by plasma nitridation, or (5) low pressure chemical vapor deposition (CVD).

The resistance of device contacts can also be adversely increased by the formation of titanium silicide having small step coverage in the contact hole. As device dimensions shrink, the contact holes become relatively deeper and narrower. Also, the walls of the contact holes become steeper, and closer to vertical. As a result, most metal deposition techniques form conductive layers having relatively small step coverage. As a result, a void, or keyhole, forms in the plug material. The void increases contact resistivity and diminishes contact reliability. Hence, IC performance is degraded. Thus, there is a need for forming contacts with reduced resistivity. Specifically, there is a need for a method of forming contacts without voids.

SUMMARY OF THE INVENTION

The present invention solves the above-mentioned problems in the art and other problems which will be understood by those skilled in the art upon reading and understanding the present specification. The present invention includes a method for forming titanium silicide and/or titanium by chemical vapor deposition (CVD), and apparatus formed by such a method. The method comprises cleaning a contact hole. A titanium precursor and a silicon precursor are combined in the presence of hydrogen ($H_2$). Titanium silicide is formed by CVD.

In another embodiment, the method includes combining a titanium precursor in the presence of hydrogen ($H_2$). Then, titanium silicide is formed by CVD on an exposed silicon surface of a contact hole.

In another embodiment, the method includes forming titanium by CVD on a conductor according to the following chemical process:

$$TiCl_4 + H_2 \rightarrow Ti + HCl.$$

In yet another embodiment, the method includes forming titanium by CVD) on an insulator according to the following chemical process:

$$TiCl_4 + H_2 \rightarrow Ti + HCl$$

In yet another embodiment, the method includes forming titanium silicide according to the following chemical process:

$$TiCl_4 + Si_nH_{2n+2} + H_2 \rightarrow TiSi + HCl,$$

wherein $TiCl_4$ is the titanium precursor, $Si_nH_{2n+2}$ is the silicon precursor, x is less than or equal to 2, and n is greater than or equal to 1.

In yet another embodiment, the titanium silicide is also formed according to the following chemical process:

$$TiCl_4 + Si + H_2 \rightarrow TiSi_x + HCl,$$

wherein x is less than or equal to 2.

In one embodiment, the apparatus is a memory, comprising a memory array, a control circuit, operatively coupled to the memory array, and address logic, operatively coupled to the memory array and the control logic. The memory array, control circuit and address logic, each including a contact The contact includes titanium silicide. Titanium nitride is formed on the titanium silicide. A plug material is formed on the titanium nitride. The plug material is substantially solid. In another embodiment, the titanium silicide formed on an exposed silicon base layer, and the exposed silicon base layer is not substantially depleted.

In yet another embodiment, the apparatus is a system, comprising a memory, and a processor coupled to the memory. The memory includes a contact. The contact includes titanium silicide. Titanium nitride is formed on the titanium silicide. A plug material is formed on the titanium nitride. The plug material is substantially solid. In yet another embodiment, the titanium silicide formed on an exposed silicon base layer, and the exposed silicon base layer is not substantially depleted.

It is an advantage of the present invention that the contacts have reduced resistivity. It is a further benefit that the contacts have increased reliability.

DETAILED DESCRIPTION OF THE INVENTION

Figure 1A:
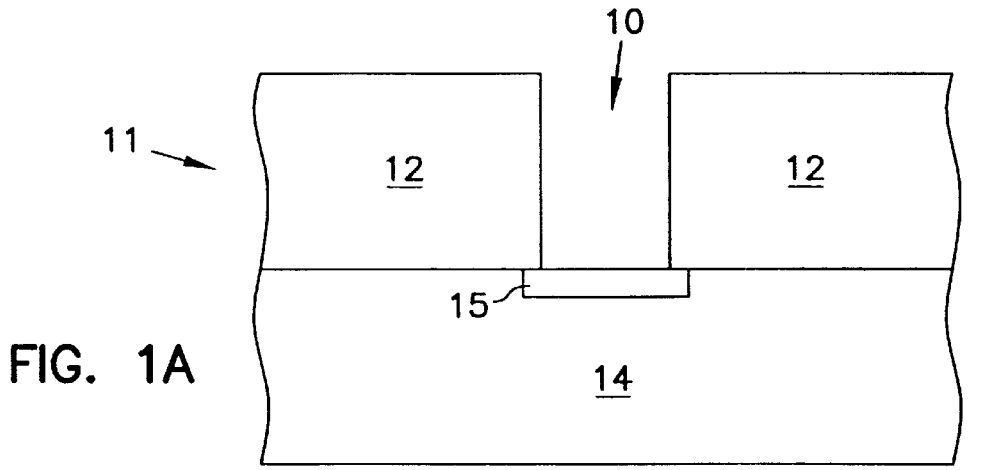
FIG. 1A is a cross-sectional view of a contact hole that has been etched through an insulator to an underlying semiconductor substrate.

In order to manufacture a contact in an integrated circuit (IC) 11, a contact hole 10, as illustrated in FIG. 1A, is etched through an insulator 12, such as borophosphosilicate glass (BPSG) or silicon dioxide, to expose a portion of the underlying silicon base layer 14, to which electrical contact is to be made. The exposed silicon base layer 14 is generally an active region 15 of a transistor in the IC 11. An optional in-situ clean of the contact hole 10 may then be performed with a wet chemical clean, or a plasma, such as a high density Ar/NF$_3$ plasma.

Figure 1B:
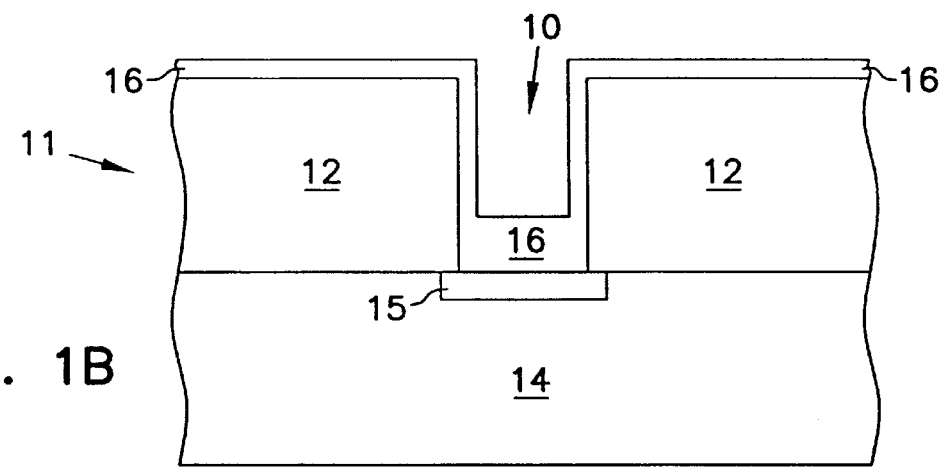
FIG. 1B is a cross-sectional view of the contact hole of FIG. 1A, comprising a silicide film formed thereon by one aspect of the present invention.

Chemical vapor deposition (CVD) is then used to form titanium silicide 16, such as TiSi$_x$, at the bottom of contact hole 10, as shown in FIG. 1B. CVD permits accurately controlled formation of films, including conformal films.

CVD techniques are well known by persons skilled in the art, and are described in Panson et al., *Appl. Phys. Lett.* 53, 1756 (1988) and Cowher et al., *J. Cryst, Growth,* 46, 399 (1979), hereby incorporated by reference. Any CVD apparatus design may be used when practicing the present invention including hot wall reactors, cold wall reactors, radiation beam assisted reactors, and plasma-assisted reactors. These CVD apparatuses are disclosed in C. E. Morosanu, "Thin Films by Chemical Vapor Deposition," Elsevier, N.Y. (1990), pages 42–54; I. P. Herman, *Chemical Reviews,* 89, 1323 (1989); U.S. Pat. No. 4,876,112; U.S. Pat. No. 5,005,519; U.S. Pat. No. 4,340,617; U.S. Pat. No. 4,713,258; U.S. Pat. No. 4,721,631; U.S. Pat. No. 4,923,717; U.S. Pat. No. 5,022,905; U.S. Pat. No. 4,868,005; U.S. Pat. No. 5,173,327, and Bachman et al., *MRS Bull.,* 13, 52 (1988), hereby incorporated by reference.

For blanket depositions, a cold wall-hot substrate reactor is sometimes preferred, as this design is efficient in regard to precursor consumption. For depositions on selection areas, a radiation beam assisted reactor may be preferred as the radiation beam may be used to selectively deposit metal containing films onto small areas of the substrate.

Different embodiments for forming titanium silicide, which may use plasma-assisted CVD (PACVD) and non-plasma CVD, are subsequently described. In a first embodiment, CVD is utilized to deposit a film of titanium silicide 16 on the top and side walls of the insulator 12, as illustrated in FIG. 1B. The titanium silicide 16 is preferably formed as a conformal film, and thus has high step coverage. This embodiment will now be described in further detail.

The IC 11 is mounted on a substrate holder in a chamber of the CVD apparatus. A titanium precursor, such as titanium tetrachloride (TiCl$_4$) and a silicon precursor, such as silane (Si$_n$H$_{2n+2}$), for example either SiH$_4$ or Si$_2$H$_6$, are combined with hydrogen (H$_2$) in the CVD apparatus to form the titanium silicide 16 in and around the contact hole 10, as illustrated in FIG. 1B. The following general chemical process (I) is used:

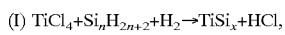

(I) TiCl$_4$+Si$_n$H$_{2n+2}$+H$_2$→TiSi$_x$+HCl, wherein, generally, n is greater than or equal to 1, and x is less than or equal to 2.

When PACVD is used, the deposition takes place in a water cooled quench chamber having a volume of approximately 6 liters. The power supply for generating a plasma can be any type of energy source, such as radio frequency (RF) or direct current (DC). When a RF power source is used, the radio frequency is approximately 13.6 MHZ. However, the present invention envisions using higher or lower frequencies. The power of the energy source used to create the plasma is between approximately 10 and 1,000 Watts, preferably approximately 600 Watts. The IC 11 is heated to a temperature between approximately 300 and 800 degrees Celsius, preferably approximately 500 degrees Celsius.

In the first embodiment, the precursor gases TiCl$_4$ and Si$_n$H$_{2n+2}$ are delivered to a plasma flame. TiCl$_4$ is introduced at a flow rate of between approximately 1 and 40 sccm, preferably approximately 20 sccm. If SiH$_4$ is used, the SiH$_4$ is introduced at a flow rate of between approximately 0.5 and 100 sccm, preferably approximately 50 sccm Alternatively, Si$_2$H$_6$ may be used, and is introduced at a flow rate of between approximately 0.05 and 50 sccm, preferably approximately 25 sccm. A sheath gas, selected from a group consisting of the noble gases and hydrogen, is employed in order to direct the plasma flame. In this example, hydrogen is introduced at a flow rate between approximately 500 and 5,000 sccm, preferably approximately 3,000 sccm. Optionally, a carrier gas, such as argon, is also introduced at a flow rate between approximately 500 and 5,000 sccm, preferably approximately 2,000 sccm.

A precursor compound, including silicon and titanium precursors, becomes a plasma gas. The precursor compound is transported via a reactor tube to the chamber. The precursor plasma, upon coming into contact with the heated IC 11, pyrolyzes and deposits a film of TiSi$_x$ 16 on the exposed surfaces of the insulator 12. The chamber pressure is between approximately 0.1 and 100 Torr, preferably approximately 5 Torr. The reaction products from the pyrolysis of the precursor compound exit from the chamber via an exhaust manifold.

For this embodiment, x is typically 2. However, x may be less than 2 when the silane flow rate is relatively low, and when $TiCl_4$ precursor flow rate is relatively high.

Alternatively, when using a non-plasma CVD method, the process parameters generally remain the same. However, in the absence of the plasma, the process temperature is increased to between approximately 600 and 900 degrees Celsius, preferably approximately 700 degrees Celsius.

Titanium silicide is typically formed on the exposed surface of the silicon base layer 14 when the titanium precursor and hydrogen contact the silicon base layer 14. This reaction is described by the following general chemical process (II):

(II) $TiCl_4 + Si + H_2 \rightarrow TiSi_2 + HCl$

However, process (II) may remove exposed silicon base layer that is the active region 15. Titanium silicide 16 will then intrude into the active region where the exposed silicon base layer was removed. The active region 15 is highly doped to reduce contact resistance. As a result of the removal, the contact resistance will undesirably increase. Therefore, preferably, sufficient silane is preferably added to the precursor compound by regulating the silane flow rate. As a result, titanium silicide over the exposed silicon base layer is at least partially formed according to process (I). Hence, the exposed silicon will not be substantially depleted. Therefore, the contact resistance will not be detrimentally increased.

Figure 2A:
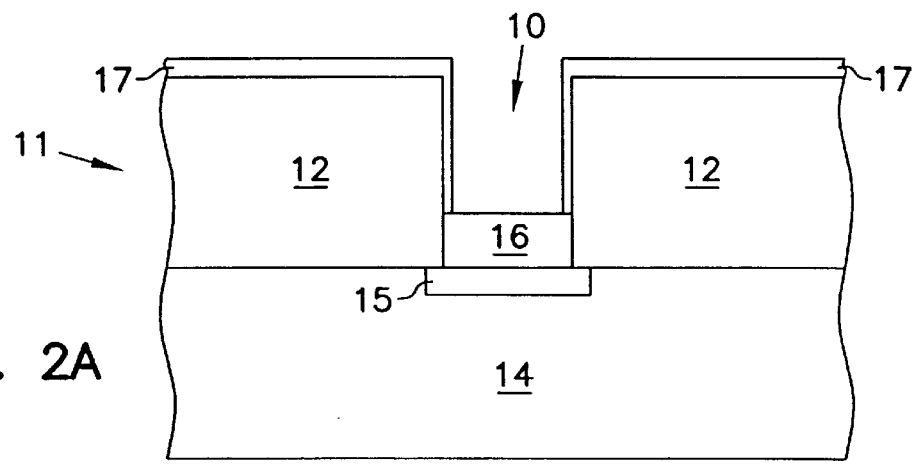
FIG. 2A is a cross-sectional view of the contact hole of FIG. 1A, comprising a silicide film formed thereon by another aspect of the invention.

In a second embodiment, CVD is used to selectively deposit a film of titanium silicide 16 on the exposed silicon base layer according to process (II), described above. If PACVD is used, the IC 11 is heated to between approximately 400 and 800 degrees Celsius. Simultaneously, a substantially thinner layer of titanium 17 is deposited on the sidewalls of the contact hole 10, as illustrated in FIG. 2A. The titanium 17 is deposited according to chemical process (III):

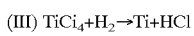

(III) $TiCl_4 + H_2 \rightarrow Ti + HCl$

Figure 2B:
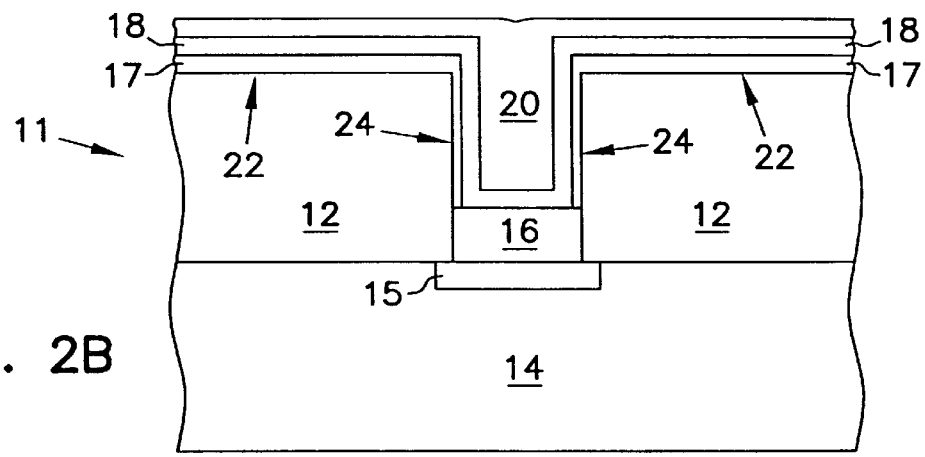
FIG. 2B is a cross-sectional view of the contact hole of FIG. 2A, further comprising a barrier layer and plug material.

As illustrated in FIG. 2B, the titanium 17 formed on the sidewalls of the insulator 12 is substantially thinner than the titanium silicide 16 formed on the base of the contact hole 10. Thus, in the event the titanium 17 on the sidewalls is formed with a retrograde, there will be substantially no voids in the subsequently formed plug material 20, illustrated in FIG. 2C. Hence, the plug-material 20 is substantially solid. The titanium 17 formed on the top of the insulator 12 is substantially thicker than the titanium 17 formed on the sidewalls of the contact hole.

The second embodiment may be implemented, for example, at a temperature of approximately 630 degrees Celsius, a pressure of approximately 5 Torr, an $H_2$ flow rate of approximately 5 slm, and a $TiCl_4$ flow rate of approximately 40 sccm. A carrier gas, such as argon, having a flow rate of approximately 5 slm, may also be used. As a result, a 500 Angstrom layer of titanium 17 is formed on the exterior surfaces 22 of the insulator 12. Little or no titanium 17 is formed in the contact hole 10, such as on the sidewalls 24 and over the active region 15, as illustrated in FIG. 2A. Additionally, approximately 2500 Angstroms of titanium silicide 16 is formed over the active region 15. Alternatively, the second embodiment may be implemented at a temperature of less than about 550 degrees Celsius. As a result, about 1250 Angstroms of titanium 17, rather than titanium silicide 16, are formed over the active region 15. The titanium 17 is subsequently converted to titanium silicide during an anneal.

Figure 2C:
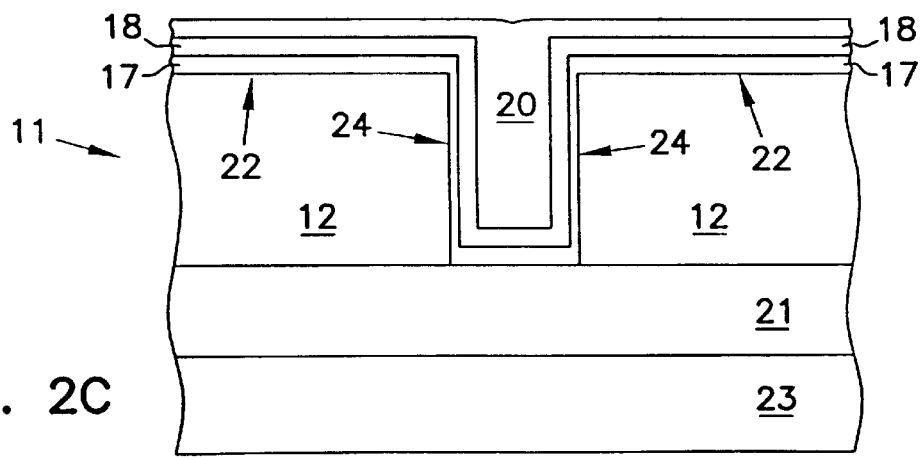
FIG. 2C is a cross-sectional view of a contact hole comprising a conductor, a barrier layer, and plug material.
Figure 3A:
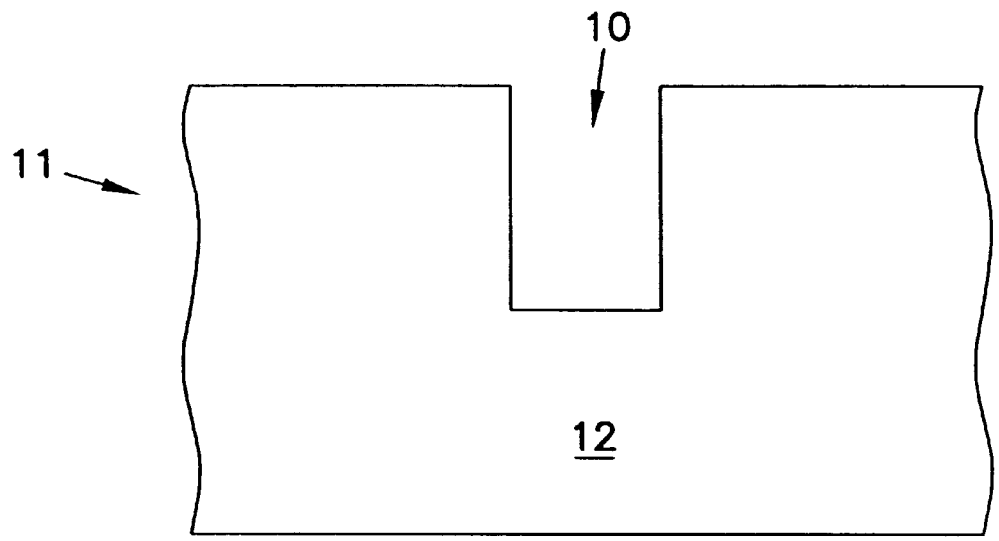
FIG. 3A is a cross-sectional view of a contact hole that has been etched into an insulator.

Chemical process (III), described above, may also be used to form a contact to a conductor 21 on an IC 11, as illustrated in FIG. 2C. The conductor 21 is typically formed over a second insulator 23 on the IC 11. The titanium 17 formed on the sidewalls of the contact hole 10 is substantially thinner than the titanium 17 formed on the base of the contact hole 10. Thus, in the event the titanium 17 on the sidewalls is formed with a retrograde, a there will be substantially no voids in the subsequently formed plug material 20, illustrated in FIG. 2C In a third embodiment, titanium silicide 16 can be formed in a contact hole in insulator 12, where no silicon base layer 14 is exposed, as illustrated in FIG. 3A. A conformal layer of titanium silicide 16 having high step coverage is formed in the contract hole 10, according to general chemical process (I) described above. For the first, second and third embodiments, the reaction products of general chemical processes (I) and (II) may also include $SiCl_4$.

Figure 1C:
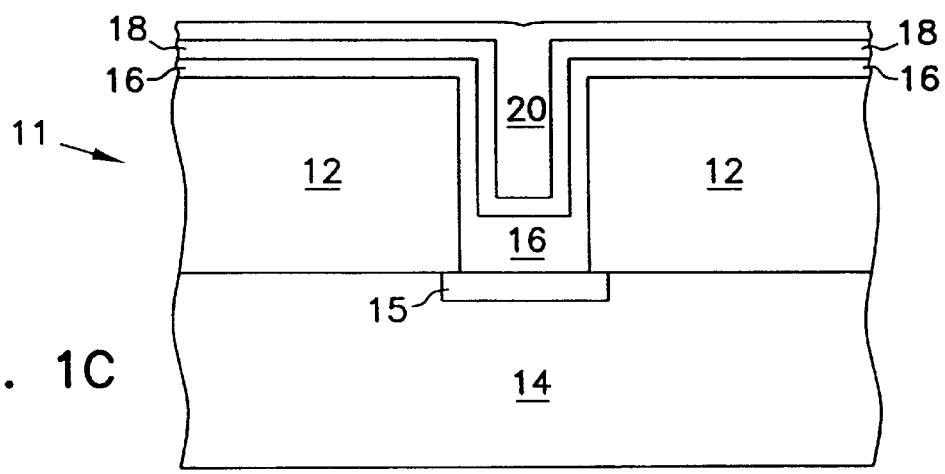
FIG. 1C is a cross-sectional view of the contact hole of FIG. 1B, further comprising a barrier layer and plug material.
Figure 3B:
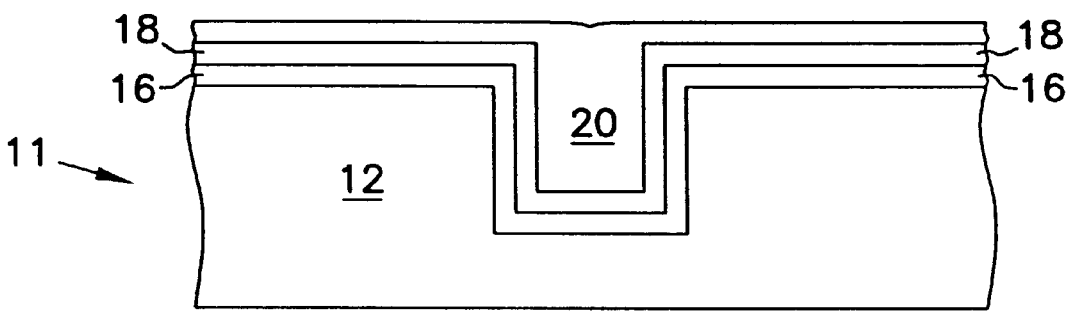
FIG. 3B is a cross-sectional view of the contact hole of FIG. 3A, further comprising a silicide film, a barrier layer and plug material formed thereon by another aspect of the invention.

Typically, after the titanium silicide 16 has been formed according to one of the embodiments described above, the barrier layer 18 is then formed in the contact hole, as illustrated in FIGS. 1C, 2B and 3B. The IC 11 may be heated before or after barrier layer 18 formation. Heating may be accomplished, for example, in a rapid thermal annealer or a furnace, in a manner known to persons skilled in the art. The heating step can convert titanium 17 proximate to exposed silicon to titanium silicide 16. Additionally, heating of previously formed titanium silicide 16 is desirable because it reduces native oxides. The plug material 20 is then formed over the barrier layer 18 to complete contact formation. The barrier layer 18 and plug material 20 may each be formed by CVD.

Figure 4:
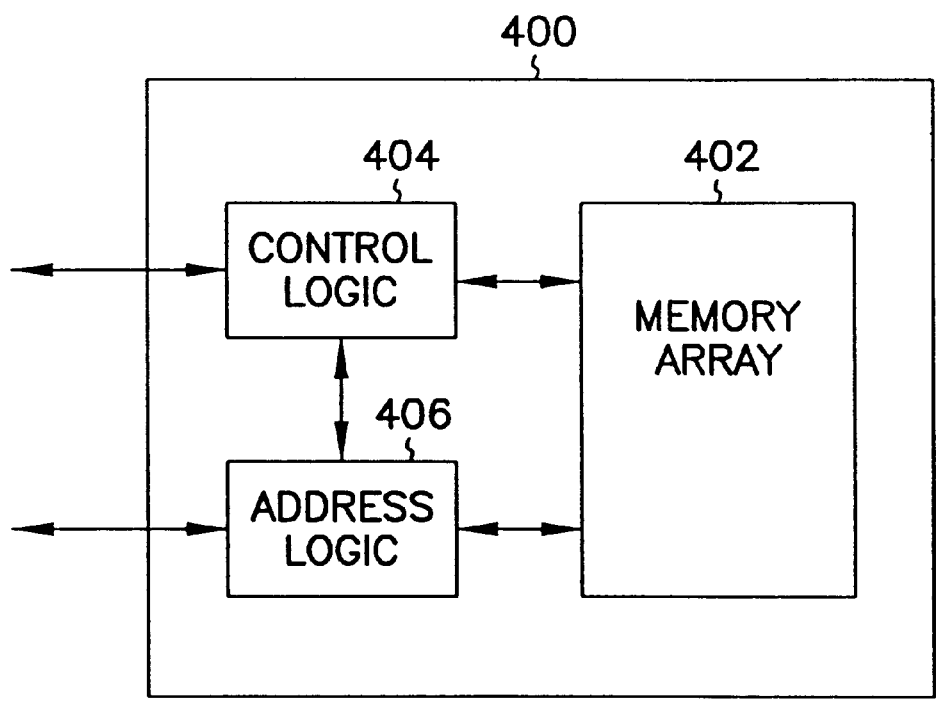
FIG. 4 is a block diagram of a memory.
Figure 5:
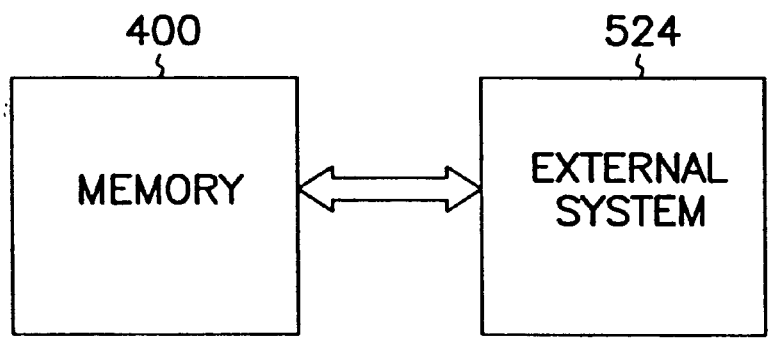
FIG. 5 is a block diagram of a memory coupled to an external system.

The aforementioned processes may be used to form contacts in an integrated circuit 11 that is a memory 400, such as a dynamic random access memory. The memory 400 may include a memory array 402, control logic 404, and address logic 406 coupled in a manner known to one skilled in the art and exemplified in FIG. 4. Each of the aforementioned elements of the memory 400 includes contacts formed in the manner described above. The memory 400 may be coupled to an external system 524, such as a processor, as illustrated in FIG. 5.

The present invention provides a method for forming low resistivity, high reliability contacts. It is to be understood that the above description is intended to be illustrative, and not restrictive. Many other embodiments will be apparent to those of skill in the art upon reviewing the above description. For example, other titanium precursors, such as tetradimethyl amino titanium (TDMAI) can be used to form titanium 17 and titanium silicide 16. Additionally, the present invention may be implemented with any CVD apparatus 29, including hot wall reactors, cold wall reactors, radiation beam assisted reactors, plasma-assisted reactors, and the like. Hence, the scope of the invention should, therefore, be determined with reference to the appended claims, along with the full scope of equivalents to which such claims are entitled.

What is claimed is:

1. A memory, comprising:

a memory array;

a control circuit, operatively coupled to the memory array; and address logic, operatively coupled to the memory array and the control circuit;

wherein at least one of the memory array, the control circuit, and the address logic includes a contact comprising:

titanium silicide, wherein the titanium silicide is produced by a method comprising forming titanium silicide by plasma-assisted chemical vapor deposition (CVD) in a CVD chamber according to a first chemical process described by $TiCl_4+Si_nH_{2n+2}+H_2 \rightarrow TiS_x+HCl$, and a second chemical process described by $TiCl_4+Si+H_2 \rightarrow TiSi_x+HCl$, wherein n is greater than or equal to 1, and x is less than or equal to 2;

titanium nitride on the titanium silicide; and a plug material on the titanium nitride.

2. A memory, comprising:

a memory array;

a control circuit, operatively coupled to the memory array;

address logic, operatively coupled to the memory array and the control circuit;

wherein at least one of the memory array, the control circuit, and the address logic includes a contact comprising:

titanium silicide formed on an exposed silicon base layer, wherein the titanium suicide is produced by a method comprising forming titanium silicide in a chemical vapor deposition chamber according to a first chemical process described by $TiCl_4+Si_nH_{2n+2}+H_2 \rightarrow TiSi_x+HCl$, and a second chemical process described by $TiCl_4+Si+H_2 \rightarrow TiSi_x+HCl$, wherein n is greater than or equal to 1, and x is less than or equal to 2;

titanium nitride on the titanium silicide; and a plug material on the titanium nitride.

3. A memory, comprising:

a memory array;

a control circuit, operatively coupled to the memory array; and address logic, operatively coupled to the memory array and the control circuit;

wherein at least one of the memory array, the control circuit, and the address logic includes a contact comprising:

titanium silicide, wherein the titanium silicide is formed by a method comprising:

combining a titanium precursor in the presence of hydrogen in a chemical vapor deposition chamber;

forming the titanium silicide on an exposed silicon base layer defining a bottom of a contact hole by reacting the titanium precursor with the silicon base layer; and operating the chemical vapor deposition chamber at a pressure of approximately between 0.1 and 100 Torr during forming the titanium silicide;

titanium, wherein the titanium is formed by a method comprising:

combining the titanium precursor in the presence of hydrogen in the chemical vapor deposition chamber;

forming the titanium on an insulator defining sidewalls of the contact hole by reacting the titanium precursor with the hydrogen; and operating the chemical vapor deposition chamber at a pressure of approximately between 0.1 and 100 Torr during forming the titanium, wherein forming the titanium and forming the titanium silicide occur substantially simultaneously;

titanium nitride on the titanium silicide; and a plug material on the titanium nitride.

4. A memory, comprising:

a memory array;

a control circuit, operatively coupled to the memory array; and address logic, operatively coupled to the memory array and the control circuit;

wherein at least one of the memory array, the control circuit, and the address logic includes a contact comprising:

titanium silicide, wherein the titanium silicide is formed by a method comprising:

combining $TiCl_4$ in the presence of hydrogen in a chemical vapor deposition chamber;

forming the titanium silicide on an exposed silicon base layer defining a bottom of a contact hole using a first chemical process described by $TiCl_4+Si+H_2 \rightarrow TiSi_x+HCl$, wherein x is less than or equal to 2; and operating the chemical vapor deposition chamber at a pressure of approximately between 0.1 and 100 Torr during forming the titanium silicide;

titanium, wherein the titanium is formed by a method comprising:

combining the $TiCl_4$ in the presence of hydrogen in the chemical vapor deposition chamber;

forming the titanium on an insulator defining sidewalls of the contact hole using a second chemical process described by $TiCl_4+H_2 \rightarrow Ti+HCl$; and operating the chemical vapor deposition chamber at a pressure of approximately between 0.1 and 100 Torr during forming the titanium, wherein forming the titanium and forming the titanium silicide occur substantially simultaneously;

titanium nitride on the titanium silicide; and a plug material on the titanium nitride.

5. A memory, comprising:

a memory array;

a control circuit, operatively coupled to the memory array; and address logic, operatively coupled to the memory array and the control circuit;

wherein at least one of the memory array, the control circuit, and the address logic includes a contact comprising:

titanium silicide, wherein the titanium silicide is formed by a method comprising:

combining tetradimethyl amino titanium in the presence of hydrogen in a chemical vapor deposition chamber;

forming the titanium silicide on an exposed silicon base layer defining a bottom of a contact hole by reacting the tetradimethyl amino titanium with the silicon base layer; and operating the chemical vapor deposition chamber at a pressure of approximately between 0.1 and 100 Torr during forming the titanium silicide;

titanium, wherein the titanium is formed by a method comprising:

combining the tetradimethyl amino titanium in the presence of hydrogen in a chemical vapor deposition chamber;

forming the titanium on an insulator defining sidewalls of the contact hole by reacting the tetradimethyl amino titanium with the hydrogen; and operating the chemical vapor deposition chamber at a pressure of approximately between 0.1 and 100 Torr during forming the titanium, wherein forming the titanium and forming the titanium silicide occur substantially simultaneously;

titanium nitride on the titanium silicide; and a plug material on the titanium nitride.

6. A memory, comprising:

a memory array;

a control circuit, operatively coupled to the memory array; and address logic, operatively coupled to the memory array and the control circuit;

wherein at least one of the memory array, the control circuit, and the address logic includes a contact comprising:

titanium silicide, wherein the titanium silicide is formed by a method comprising:

combining a titanium precursor and a silicon precursor in the presence of hydrogen in a chemical vapor deposition chamber;

forming the titanium silicide on a silicon base layer by reacting the titanium precursor with the silicon precursor and by reacting the titanium precursor with the silicon base layer; and operating the chemical vapor deposition chamber at a pressure of approximately between 0.1 and 100 Torr during forming the titanium silicide;

titanium nitride on the titanium silicide; and a plug material on the titanium nitride.

7. A memory, comprising:

a memory array;

a control circuit, operatively coupled to the memory array; and address logic, operatively coupled to the memory array and the control circuit;

wherein at least one of the memory array, the control circuit, and the address logic includes a contact comprising:

titanium silicide, wherein the titanium silicide is formed by a method comprising:

combining $TiCl_4$ and $Si_nH_{2n+2}$ in the presence of hydrogen in a chemical vapor deposition chamber, wherein n is greater than 1;

forming the titanium silicide on a silicon base layer using a first chemical process described by $TiCl_4 + Si_nH_{2n+2} \rightarrow TiSi_x + HCl$ and using a second chemical process described by $TiCl_4 + Si + H_2 \rightarrow TiSi_x + HCl$, wherein x is less than or equal to 2; and operating the chemical vapor deposition chamber at a pressure of approximately between 0.1 and 100 Torr during forming the titanium silicide;

titanium nitride on the titanium silicide; and a plug material on the titanium nitride.

8. A memory, comprising:

a memory array;

a control circuit, operatively coupled to the memory array; and address logic, operatively coupled to the memory array and the control circuit;

wherein at least one of the memory array, the control circuit, and the address logic includes a contact comprising:

titanium silicide, wherein the titanium silicide is formed by a method comprising:

combining $Ti(N(CH_3)_2)_4$ and $Si_nH_{2n+2}$ in the presence of hydrogen in a chemical vapor deposition chamber, wherein n is greater than 1;

forming the titanium silicide on a silicon base layer by reacting the $Ti(N(CH_3)_2)_4$ with the $Si_nH_{2n+2}$ and by reacting the $Ti(N(CH_3)_2)_4$ with the silicon base layer; and operating the chemical vapor deposition chamber at a pressure of approximately between 0.1 and 100 Torr during forming the titanium silicide;

titanium nitride on the titanium silicide; and a plug material on the titanium nitride.

* * * * *